United States Patent
Kim et al.

(10) Patent No.: US 11,556,043 B2
(45) Date of Patent: Jan. 17, 2023

(54) MONOLITHIC III-V-ON-SILICON OPTO-ELECTRONIC PHASE MODULATOR WITH A RIDGE WAVEGUIDE

(71) Applicant: IMEC VZW, Leuven (BE)

(72) Inventors: Younghyun Kim, Leuven (BE); Didit Yudistira, Kessel-Lo (BE); Bernardette Kunert, Wilsele (BE); Joris Van Campenhout, Leuven (BE); Maria Ioanna Pantouvaki, Kessel-Lo (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/348,049

(22) Filed: Jun. 15, 2021

(65) Prior Publication Data
US 2022/0011641 A1   Jan. 13, 2022

(30) Foreign Application Priority Data

Jul. 8, 2020   (EP) .................................... 20184635

(51) Int. Cl.
  *G02F 1/225*   (2006.01)
  *G02F 1/21*    (2006.01)
  (Continued)

(52) U.S. Cl.
  CPC ............ *G02F 1/2257* (2013.01); *G02F 1/212* (2021.01); *H01L 29/66181* (2013.01); *H01L 29/94* (2013.01); *G02F 2201/063* (2013.01)

(58) Field of Classification Search
  CPC .. G02F 1/2257; G02F 1/212; G02F 2201/063; G02F 1/025; H01L 29/66181; H01L 29/94; G02B 6/131
  See application file for complete search history.

(56) References Cited

U.S. PATENT DOCUMENTS

| | | |
|---|---|---|
| 8,538,206 B1 | 9/2013 | Fish et al. |
| 8,824,837 B2 | 9/2014 | Ren et al. |
| 8,938,134 B2 | 1/2015 | Chen |
| 9,568,750 B2 * | 2/2017 | Spann ............... H01L 21/02538 |
| 2006/0035450 A1 | 2/2006 | Martin |

(Continued)

FOREIGN PATENT DOCUMENTS

| | | |
|---|---|---|
| EP | 3506000 A1 | 7/2019 |
| EP | 3581993 A1 | 12/2019 |

(Continued)

OTHER PUBLICATIONS

Extended European Search Report from the European Patent Office, dated Dec. 22, 2020, for European Patent Application No. 20184635.9, pp. 1-5.

(Continued)

*Primary Examiner* — John Bedtelyon
(74) *Attorney, Agent, or Firm* — McDonnell Boehnen Hulbert & Berghoff LLP

(57) ABSTRACT

A monolithic integrated electro-optical phase modulator, a Mach-Zehnder modulator including one or more of the phase modulators, and method for fabricating the phase modulator by III-V-on-silicon semiconductor processing are provided. The phase modulator includes a silicon-based n-type substrate base layer, and a III-V n-type ridge waveguide for propagating light, wherein the ridge waveguide protrudes from and extends along the n-type substrate base layer. Further, the phase modulator includes one or more insulating layers provided on the ridge waveguide, wherein the one or more insulating layers have together a thickness of 1-100 nm, and a silicon-based p-type top cover layer provided on the one or more insulating layers at least above the ridge waveguide.

19 Claims, 15 Drawing Sheets

(51) Int. Cl.
*H01L 29/66* (2006.01)
*H01L 29/94* (2006.01)

(56) References Cited

U.S. PATENT DOCUMENTS

| | | |
|---|---|---|
| 2010/0148322 A1 | 6/2010 | Allibert |
| 2010/0266233 A1 | 10/2010 | Morris |
| 2011/0073989 A1 | 3/2011 | Rong |
| 2011/0097030 A1 | 4/2011 | Urino |
| 2013/0062665 A1 | 3/2013 | Kunert |
| 2015/0055910 A1 | 2/2015 | Liang |
| 2018/0074349 A1 | 3/2018 | Fujikata |

FOREIGN PATENT DOCUMENTS

| | | |
|---|---|---|
| WO | 2016/157687 A1 | 10/2016 |
| WO | 2019/038600 A1 | 2/2019 |
| WO | 2019/219703 A1 | 11/2019 |

OTHER PUBLICATIONS

Lee, S.C., et al., "Nanoscale Spatial Phase Modulation of GaN on a V-Grooved Si Substrate-Cubic Phase GaN on Si(001) for Monolithic Integration", IEEE Journal of Quantum Electronics, Apr. 2005, vol. 41(4), pp. 596-605.

Ohno, S., et al., "Taper-less 111-V/Si Hybrid MOS Optical Phase Shifter using Ultrathin InP Membrane", Department of Electrical Engineering and Information Systems, The University of Tokyo, OFC, 2020, pp. 1-3.

Ramirez, J.M., et al., "III-V-on-Silicon Integration: From Hybrid Devices to Heterogeneous Photonic Integrated Circuits", IEEE Journal of Selected Topics in Quantum Electronics, Mar./Apr. 2020, vol. 26(2), pp. 1-13.

Takenaka, M., et al., "III-V/Si Hybrid MOS Optical Phase Shifter for Si Photonic Integrated Circuits", Journal of Lightwave Technology, Mar. 1, 2019, vol. 37(5), pp. 1474-1483.

* cited by examiner

MONOLITHIC III-V-ON-SILICON OPTO-ELECTRONIC PHASE MODULATOR WITH A RIDGE WAVEGUIDE

CROSS-REFERENCE

This application claims priority from European Patent application no. 20184635.9, filed on Jul. 8, 2020, which is incorporated by reference in its entirety.

TECHNICAL FIELD

The present disclosure relates to the field of electro-optical devices, in particular, of electro-optical modulators. The disclosure provides a monolithic integrated electro-optical phase modulator, which is based on III-V-on-silicon semiconductor processing of a ridge waveguide. The disclosure further provides a method for fabricating the electro-optical phase modulator, and a Mach-Zehnder modulator comprising at least one such electro-optical phase modulator.

BACKGROUND OF THE DISCLOSURE

Electro-optical modulators are essential building blocks in silicon (Si) photonics, and are used to modulate light, e.g., to phase modulate the light. A conventional silicon-based optical phase modulator employs the free-carrier plasma dispersion effect, in order to achieve a phase modulation by means of a carrier density modulation in the light propagation material.

However, the efficiency of such a conventional silicon-based phase modulator may be inherently limited by the effective mass of carriers in the silicon-based material, since the amount of their modulation is inversely proportional to the effective mass. Therefore, some efforts have been devoted to use III-V semiconductor materials rather than silicon-based materials, and to utilize their lower effective mass.

As an example, a III-V/silicon hybrid phase modulator may be fabricated by using a wafer bonding process, which may be, however, a questionable process for higher-volume manufacturing.

As another example, a monolithic integrated III-V/silicon hybrid phase modulator may be fabricated by a process of epitaxial growth of the III-V semiconductor material on the silicon, which process may be more favorable for mass production. However, in this example the phase modulator often suffers from performance degradations, due to a too low crystal quality of the epitaxially grown III-V semiconductor material.

SUMMARY OF THE DISCLOSURE

In view of the above-mentioned disadvantages, embodiments of the present disclosure aim to provide an improved electro-optical phase modulator. An objective is, in particular, to provide a monolithic integrated optical phase modulator, which makes use of the lower effective mass of III-V semiconductor materials, but does not suffer from performance degradations caused by too low crystal quality of the III-V semiconductor material. The process for fabricating the electro-optical phase modulator should further be favorable for high-volume production. In addition, the electro-optical phase modulator should be suitable for implementation in various optical blocks, like in a Mach-Zehnder modulator.

The objective may be achieved by the embodiments of the disclosure provided in the enclosed independent claims. Beneficial implementations of these embodiments are defined in the dependent claims.

In particular, in order to overcome the above-mentioned problems of the exemplary phase modulators, embodiments of the disclosure propose a monolithic III-V-on-silicon electro-optical phase modulator that comprises a ridge waveguide to propagate light.

A first aspect of the present disclosure, a monolithic integrated electro-optical phase modulator is provided, wherein the phase modulator comprises, in an optical modulation region: a silicon-based n-type base layer; an n-type ridge waveguide for propagating light, wherein the ridge waveguide protrudes from and extends along the n-type base layer and is made of III-V semiconductor material; one or more insulating layers provided on the ridge waveguide, wherein the one or more insulating layers have together a thickness in a range of 1-100 nm; and a silicon-based p-type cover layer provided on the one or more insulating layers at least above the ridge waveguide, wherein the n-type ridge waveguide, the one or more insulating layers, and the p-type cover layer form together a monolithically integrated semiconductor-insulator-semiconductor (SIS) capacitor for phase modulating the light propagating along the ridge waveguide in the optical modulation region.

The phase modulator of the first aspect is a monolithic integrated optical phase modulator, which makes use of the lower effective mass of the III-V semiconductor material of the ridge waveguide. However, the phase modulator does not suffer from a too low crystal quality of the III-V semiconductor material. This is possible because of the ridge waveguide, which may lead to defects in the semiconductor material being trapped in a bottom portion thereof, particularly a portion where the ridge waveguide does not propagate the main part of the light that is to be phase modulated. In particular, the light propagates mainly at the interfaces defining the SIS capacitor, i.e. in a top portion of the ridge waveguide, where it can be phase modulated.

Moreover, a process for fabricating the electro-optical phase modulator can be favorable for high-volume production, since epitaxy can be used and wafer bonding is not necessary.

In an implementation, the phase modulator further comprises: one or more first contacts provided on the n-type base layer; and one or more second contacts provided on the p-type cover layer; wherein a voltage applied between the one or more first contacts and the one or more second contacts causes the light propagating along the ridge waveguide to be phase modulated in the optical modulation region.

The first and second contacts thus allow controlling the phase modulation of the light in the optical modulation region of the phase modulator, e.g., allow controlling whether the phase of the light is modulated at all, and/or how strong the phase of the light is modulated. The first and second contacts may in particular control a charge state of the SIS capacitor. The p-type silicon based cover layer and the one or more insulating layers may thereby function like a gate contact and gate insulator, respectively, to modify the carrier density in the top region of the n-type ridge waveguide.

In an implementation of the phase modulator, the one or more insulating layers and the p-type cover layer are planar and provided on a planar top surface of the ridge waveguide.

This implementation form enables a simple manufacturing process. For instance, the ridge waveguide may be embedded into a dielectric material, and Chemical Mechanical Polishing (CMP) may be used to provide a common planar surface, onto which the one or more insulating layers can then be provided with high layer quality and precision.

In an implementation of the phase modulator, the one or more insulating layer and the p-type cover layer may be wrapped around a top portion of the ridge waveguide.

This implementation form can allow a more efficient and precise control of the carrier density in the ridge waveguide.

In an implementation of the phase modulator, the ridge waveguide, the one or more insulating layers, and the p-type cover layer may be surrounded by or embedded into a dielectric material.

This isolates the SIS capacitor to its surrounding, and may thus improves the performance of the phase modulator. In particular, a phase of light propagating in the ridge waveguide can be modulated in the modulation region efficiently and accurately.

In an implementation the phase modulator comprises, in an optical transition region: a silicon-based not-intentionally-doped (NID) base layer; the n-type ridge waveguide protruding from and extending along the NID base layer; the one or more insulating layers provided on the ridge waveguide; and a silicon-based NID cover layer provided on the one or more insulating layers at least above a part of the ridge waveguide.

The optical transition region allows guiding the light that propagates in the ridge waveguide out of and away from the optical modulation region, for instance, in order to couple it to another waveguide, or to provide it to some other optical block of an optical system. Notably, the NID base layer and the n-type base layer may be formed from one base layer that is selectively n-doped. For instance, the top layer of a SOI substrate may be selectively n-doped, and the ridge waveguide may be formed accordingly across the doped and undoped regions of the top layer. Likewise, the NID cover layer and p-type cover layer may be formed from one cover layer that is selectively p-doped.

In an implementation, the phase modulator further comprises: a silicon-based waveguide formed adjacent to the ridge waveguide on or by the NID base layer.

The silicon-based waveguide may, for example, be made from silicon or silicon nitride. The silicon-based waveguide may be used to guide light to and from the modulation region of the phase modulator.

In an implementation of the phase modulator, the ridge waveguide and the silicon-based waveguide may be configured and arranged such that light propagating along one of the waveguides is coupled into the other one of the waveguides.

For instance, the silicon-based waveguide may be tapered, or have a tapered end, or may be curved, to support and/or tailor the coupling. The silicon-based waveguide may be placed at a determined distance to the ridge waveguide, and may have one or more determined dimensions, in order to enable an efficient light coupling from the one waveguide to the other.

In an implementation of the phase modulator, the NID cover layer may be tapered in the optical transition region.

This supports the coupling from the ridge waveguide to the silicon-base waveguide and vice versa.

In an implementation of the phase modulator, the ridge waveguide may be partly arranged in a trench formed in the n-type and/or NID base layer; and/or the ridge waveguide may be grown on a V-groove formed in the n-type and/or NID base layer.

This has the benefit that defects may be efficiently trapped in a bottom portion of the ridge waveguide, e.g. the portion arranged in the trench or groove. This may lead to significantly less defects in a top portion of the ridge waveguide closer to or where the SIS capacitor is formed. For instance, an Aspect Ratio Trapping, ART, technique may be used to reduce the defects. The silicon V-groove improves the quality of the growth of the III-V semiconductor material of the ridge waveguide, and thus leads to a further improved performance of the phase modulator.

In an implementation of the phase modulator, the n-type and/or NID base layer may be formed by a top layer of a silicon-on-insulator substrate.

In an implementation of the phase modulator, the ridge waveguide comprises a narrower bottom portion arranged on the n-type and/or NID base layer, and a wider top portion arranged on top of the bottom portion; and the wider top portion has a rectangular cross-section or a triangular cross-section.

This narrower and wider portions can support the ART of defects in the lower portion of the ridge waveguide.

In an implementation of the phase modulator, the ridge waveguide comprises two portions protruding side by side from the n-type and/or NID base layer.

This may further enable a particular effective wrapping of the one or more insulating layers and cover layer around the ridge waveguide, and thus a particular effective modulation of the carrier density in the ridge waveguide.

A second aspect of the present disclosure provides a Mach-Zehnder modulator comprising: an optical input and an optical output; a first waveguide arm and a second waveguide arm, wherein each waveguide arm connects the optical input with the optical output; and one or more phase modulators according to the first aspect or any implementation form thereof, wherein at least one of the phase modulators is arranged in the first waveguide arm and/or in the second waveguide arm.

Thus, the electro-optical phase modulator of the first aspect may be suitable for implementation in optical building blocks, like the Mach-Zehnder modulator of the second aspect. The Mach-Zehnder modulator enjoys the benefits of the phase modulator(s), and can modulate the light with high performance.

A third aspect of the present disclosure provides a method for fabricating a monolithic integrated electro-optical phase modulator, wherein for fabricating an optical modulation region of the phase modulator, the method comprises: providing a silicon-based n-type base layer; growing an n-type ridge waveguide for propagating light, wherein the ridge waveguide is grown protruding from and extending along the n-type base layer and is made of III-V semiconductor material; forming one or more insulating layers on the ridge waveguide, wherein the one or more insulating layers have together a thickness in a range of 1-100 nm; and forming a silicon-based p-type cover layer on the one or more insulating layers at least above the ridge waveguide, wherein the n-type ridge waveguide, the one or more insulating layers, and the p-type cover layer form together a monolithically integrated semiconductor-insulator-semiconductor capacitor for phase modulating the light propagating along the ridge waveguide in the optical modulation region.

The method of the second aspect can achieves the same benefits as the phase modulator of the first aspect and may be extended by respective implementations as described above for the phase modulator of the first aspect.

BRIEF DESCRIPTION OF THE DRAWINGS

The above described aspects and implementations are explained in the following description of embodiments with respect to the enclosed drawings.

DETAILED DESCRIPTION OF EMBODIMENTS OF THE DISCLOSURE

Figure 1:
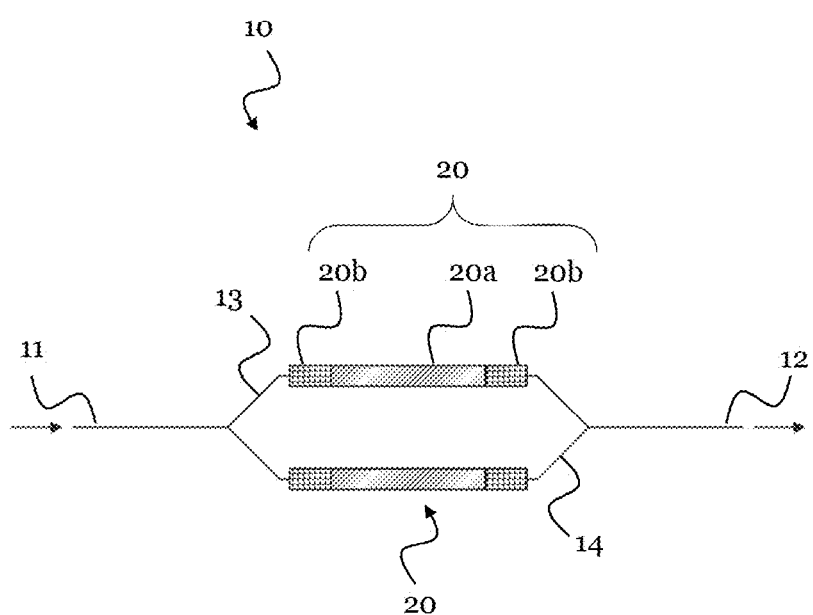
FIG. 1 shows a Mach-Zehnder modulator according to an embodiment of the disclosure, which exemplarily comprises two phase modulators according to embodiments of the disclosure.

FIG. 1 illustrates an example how a phase modulator 20 according to an embodiment of the disclosure can be used. In particular, FIG. 1 shows schematically a Mach-Zehnder modulator 10 according to an embodiment of the disclosure. The Mach-Zehnder modulator 10 comprises exemplarily two of the phase modulators 20.

In particular, the Mach-Zehnder modulator 10 comprises and optical input 11 and an optical output 12. The lines between the optical input 11 and optical output 12 represent silicon-based (e.g., silicon or silicon nitride) waveguides. The Mach-Zehnder modulator 10 further comprises two waveguide arms, namely a first waveguide arm 13 and a second waveguide arm 14. Each waveguide arm 13, 14 connects the optical input 11 with the optical output 12.

The Mach-Zehnder modulator 10 is illustrated to have one phase modulator 20 arranged in the first waveguide arm 13 and another phase modulator 20 arranged in the second waveguide arm 14. Generally, the Mach-Zehnder modulator 10 may comprise at least one phase modulator 20 in at least one waveguide arm 13, 14. Each phase modulator 20 comprises a waveguide transition (i.e., the optical transition region) and a phase shifter (i.e., the optical modulation region). III-V semiconductor material is used in the optical modulation region and in the optical transition region, in particular, for forming the ridge waveguide, as explained in more detail below.

Figure 2:
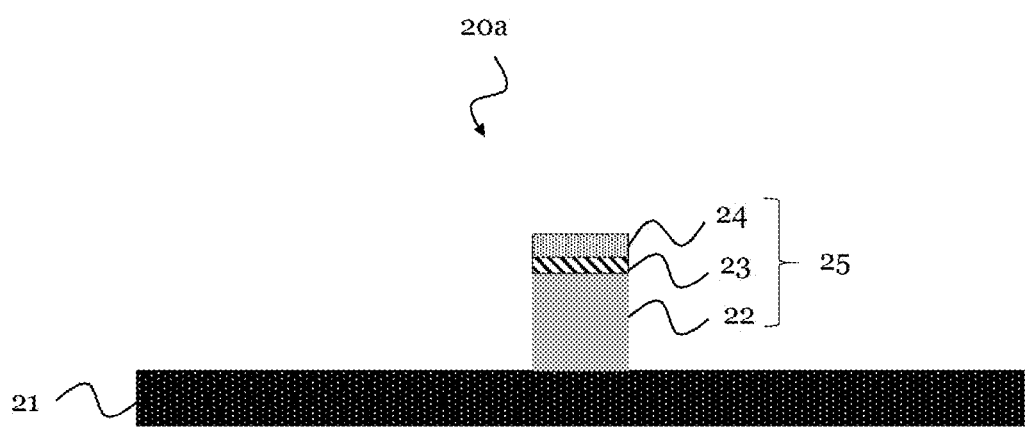
FIG. 2 illustrates an SIS capacitor in a phase modulator according to an embodiment of the disclosure.

FIG. 2 illustrates a cross-section of an electro-optical phase modulator 20 according to an embodiment of the disclosure, in particular, of an SIS capacitor formed in the optical modulation region of the phase modulator 20. The phase modulator 20 can be a monolithic integrated phase modulator 20, i.e., all elements shown in FIG. 2 may be grown on top of each other and in one fabrication process flow. The phase modulator 20 may thus a monolithic III-V on silicon optical phase shifter.

In the optical modulation region, the phase modulator 20 comprises a silicon-based n-type base layer 21, an n-type ridge waveguide 22 protruding from and extending along (here in a direction into the plane of FIG. 2) the n-type base layer 21, one or more insulating layers 23 provided on the ridge waveguide 22, and a silicon-based p-type cover layer 24 provided on the one or more insulating layers 23, at least above the ridge waveguide 22.

The silicon-based n-type layer 21 may be made of silicon or silicon nitride. For instance, it may be a top layer of a SOI substrate, wherein the top layer is n-doped at least in the optical modulation region of the phase modulator 20.

The ridge waveguide 22 may be configured to propagate light, in particular along its extension direction on the base layer 21. The ridge waveguide 22 may be made of III-V semiconductor material. For instance, it may comprise gallium arsenide (GaAs), indium gallium arsenide (InGaAs), indium phosphide (InP), and/or indium gallium arsenide phosphide (InGaAsP). The semiconductor III-V material may be doped with silicon (Si), germanium (Ge), selenium (Se), and/or tellurium (Te).

The one or more insulating layers 23 have together a thickness in a range of 1-100 nm, particularly in a range of 1-50 nm, more particularly below 40 nm. The very thin one or more insulating layers 23 may allow the optical mode of the light to be confined in the top part of the ridge waveguide 22, particularly, in the SIS capacitor 25. The highest optical intensity of the mode may even be present at the insulating layers 23, while the optical mode can spread from the top region of the ridge waveguide 22 into the cover layer 24. At the same time, the thin insulating layers 23 can still act as a gate insulator, allowing a modification of the carrier density in the top region of the ridge waveguide 22. The one or more insulating layers 23 may be optically transparent for the light propagating along the ridge waveguide 22. The one or more insulating layers 23 may comprise an aluminum oxide ($Al_2O_3$) layer, and/or a silicon oxide ($SiO_2$) layer, and/or a hafnium oxide ($HfO_2$) layer, and/or a high k dielectric material layer.

The p-type silicon based cover layer 24 may comprises a p-type polycrystalline silicon (poly-Si) layer, a p-type silicon layer, a p-type polycrystalline silicon germanium (poly-SiGe) layer, and/or a p-type silicon germanium (SiGe) layer.

Figure 3:
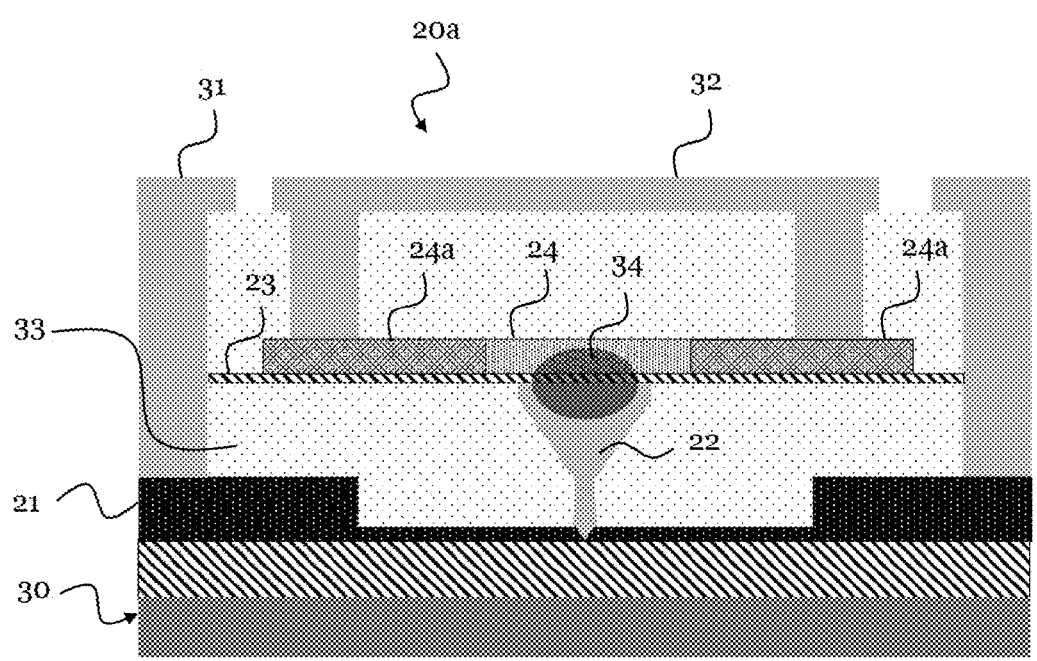
FIG. 3 shows a phase modulator according to an embodiment of the disclosure with planar insulating layer(s) and cover layer, in particular an optical modulation region of the phase modulator.

FIG. 3 shows a cross-section of an optical modulation region of a phase modulator 20 according to an embodiment of the disclosure, which builds on the embodiment shown in FIG. 2. Same elements in FIG. 2 and FIG. 3 may be labelled with the same reference signs and may be implemented likewise. In particular, FIG. 3 shows a phase modulator with planar insulating layer(s) 23 and planar cover layer 24.

Like in FIG. 2, the n-type doped III-V semiconductor-material ridge waveguide 22 may be epitaxially grown on a highly n-type doped silicon-based base layer 21, for instance, the top layer of a SOI substrate. The SOI substrate may comprise a silicon substrate, a buried oxide (BOX) having a thickness of around 2 µm, and a silicon top layer having a thickness of 200-250 nm, e.g., around 215 nm. However, where the top layer of the SOI substrate forms the n-type base layer 21, it may have a reduced thickness of around 50-60 nm. The one or more insulating layers 23 may be formed on the planarized III-V semiconductor material of the ridge structure 22, and in this embodiment a planarized surface of a dielectric material 33, which surrounds or embeds the ridge waveguide 22, and the III-V semiconductor material is formed. The cover layer 24 may be provided on the one or more insulating layers 23. As shown, the dielectric material 33 may further surround or embed also the one or more insulating layers 23, and also the p-type top cover layer 24.

Further, one or more first contacts 31 may be provided on the n-type substrate base layer 21, and one or more second contacts 32 may be provided on the p-type cover layer 24. In particular, metal contacts 31, 32, may be provided onto these doped layers, and may be constructed for providing an electrical signal terminal. By applying a bias voltage to one of the contacts 31, 32 and grounding the other contacts 32, 31, carriers may be significantly modulated at the interfaces of the SIS capacitor 25. As a consequence, the voltage applied between the one or more first contacts 31 and the one or more second contacts 32 may cause light propagating along the ridge waveguide 22 to be phase modulated in the optical modulation region.

The optical mode of the light may be confined in the SIS capacitor 25 as it is depicted by the circle in FIG. 3, and the highest optical intensity may be present at the insulating layers 23 (unlike as, e.g., in laser diode or photodiode applications, the III-V semiconductor material of the ridge waveguide 22 is here transparent for the light wavelengths, which may be wavelengths used for optical communications. Therefore, electrons at the insulating layer/n-type III-V semiconductor material interface can mainly attribute to optical modulation efficiently, as well as holes at the p-type silicon-based layer/insulating layer interface.

The ridge waveguide 22 shown in FIG. 3 further comprises a narrower bottom portion arranged on the n-type base layer 21, and a wider top portion arranged on top of the bottom portion. The bottom portion may have a width of 50-100 nm, e.g. around 70, nm and a height of 200-250 nm, e.g. around 215 nm, while the wider portion may have a width of up to 400-500 nm, e.g. 450 nm (at the widest portion, of here a triangular top portion) and a height of 300-350 nm, e.g. around 325 nm.

Further, the ridge waveguide 22, in particular the narrower portion thereof, may be partly arranged in a trench 110 (see also FIG. 11 and FIG. 14) formed in the n-type base layer 21. The ridge waveguide 22, in particular the narrower portion thereof, may be grown (e.g., epitaxially) on a V-groove formed in the n-type base layer 21. That is, and ART technique may be applied in the formation of the ridge waveguide 22, and may trap defects in the narrower bottom portion. The wider top portion may therefore be defect free, or at least may comprise significantly less defects. Since the optical mode of light propagating in the ridge waveguide 22 can be located in the narrower top portion, a better performance can be achieved.

In the exemplary embodiment of FIG. 3, the one or more insulating layers 23 comprise aluminum oxide. The cover layer 24 further comprises p-type poly-Si. The n-type base layer 21 comprises silicon. The first contacts 31 and second contacts 32 are made of metal.

Figure 4:
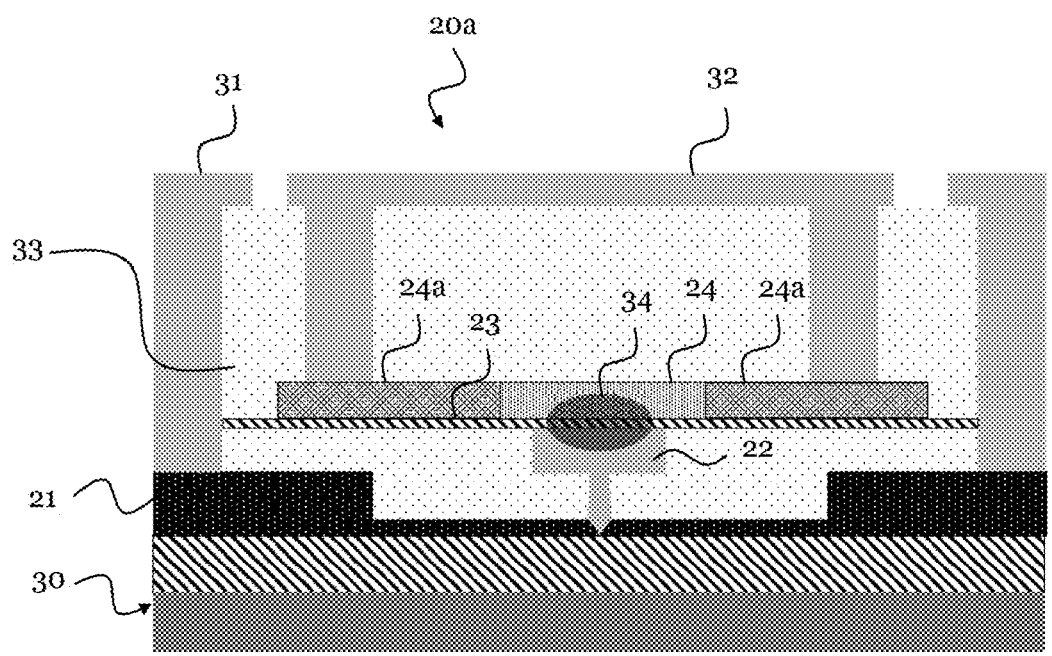
FIG. 4 shows another phase modulator according to an embodiment of the disclosure with planar insulating layer(s) and cover layer, in particular an optical modulation region of the phase modulator.

FIG. 4 shows a cross-section of an optical modulation region of another phase modulator 20 according to an embodiment of the disclosure, which builds on the embodiment shown in FIG. 2, and shares elements with the embodiment shown in FIG. 3. Same elements in FIG. 2, FIG. 3, and FIG. 4 are labelled with the same reference signs and may be implemented likewise. In particular, FIG. 4 shows another phase modulator with planar insulating layer(s) 23 and cover layer 24.

The difference between the embodiments of the phase modulators 20 shown in FIG. 3 and FIG. 4, respectively, is that in FIG. 3 the top portion of the ridge waveguide 22 has a triangular cross-section, while it has a rectangular cross-section in FIG. 4. The rectangular cross-section may benefit from an improved waveguide transition to another silicon-based waveguide (to be described later). The rectangular top portion may have a height of 100-200 nm, e.g. around 150 nm and a width of 400-500 nm, e.g. around 450 nm, while the bottom portion may be dimensioned like in FIG. 3.

Figure 5:
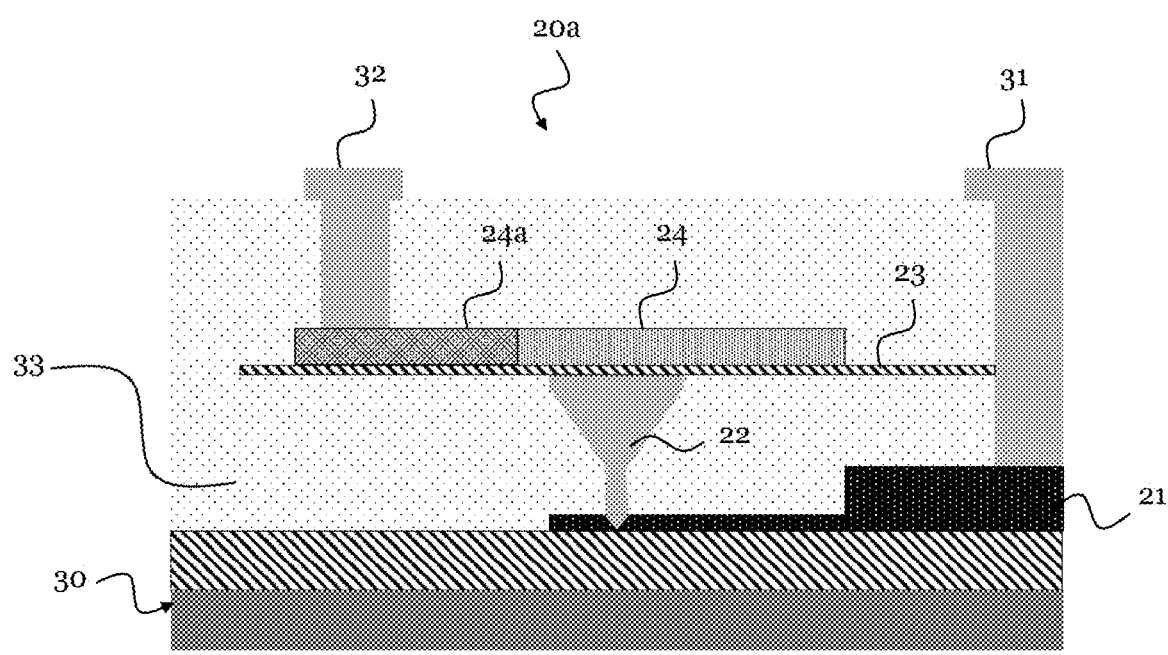
FIG. 5 shows another phase modulator according to an embodiment of the disclosure with planar insulating layer(s) and cover layer, in particular an optical modulation region of the phase modulator.

FIG. 5 shows a cross-section of an optical modulation region of another phase modulator 20 according to an embodiment of the disclosure, which builds on the embodiment shown in FIG. 2, and shares elements with the embodiment shown in FIG. 3. Same elements in FIG. 2, FIG. 3, and FIG. 5 are labelled with the same reference signs and may be implemented likewise. In particular FIG. 5 shows another phase modulator 20 with planar insulating layer(s) 23 and cover layer 24.

In principle, the phase modulator 20 shown in FIG. 5 is based on the same concept as the phase modulator 20 shown in FIG. 3. However, in the phase modulator 20 of FIG. 5, the contacts 31, 32 can be reduced in number as depicted. In particular, the phase modulator 20 comprises just one first contact 31 connected to the n-type base layer 21, and just one second contact connected to the p-type cover layer 24.

Figure 6:
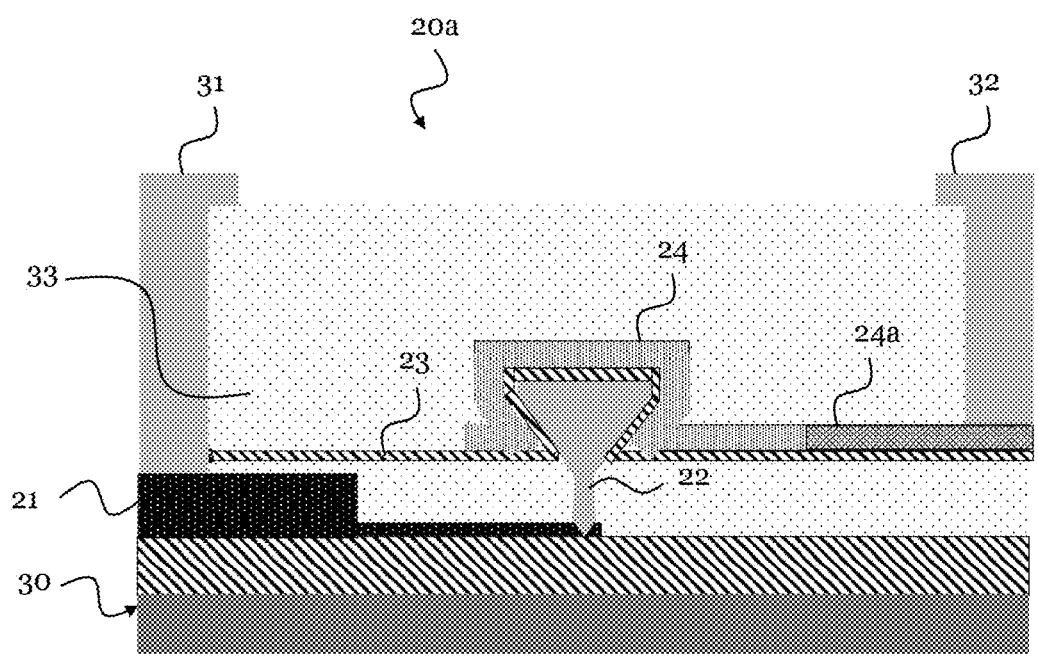
FIG. 6 shows a phase modulator according to an embodiment of the disclosure with non-planar insulating layer(s) and cover layer, in particular an optical modulation region of the phase modulator.

FIG. 6 shows a cross-section of an optical modulation region of another phase modulator 20 according to an embodiment of the disclosure, which builds on the embodiment shown in FIG. 2, and shares some elements with the embodiment shown in FIG. 5. Same elements in FIG. 2, FIG. 5, and FIG. 6 are labelled with the same reference signs and may be implemented likewise. In particular, the phase modulator 20 of FIG. 6 comprises non-planar insulating layer(s) 23 and non-planar cover layer 24. The one or more insulating layers 23 and the p-type cover layer 24 are, respectively, wrapped around a top portion of the ridge waveguide 22.

Figure 7:
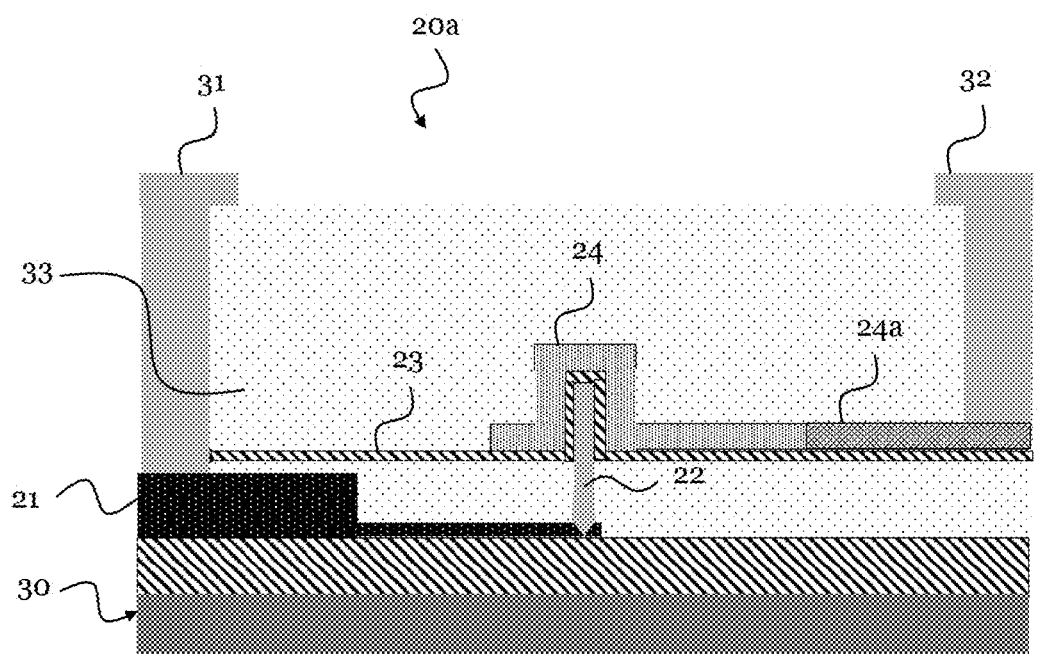
FIG. 7 shows another phase modulator according to an embodiment of the disclosure with non-planar insulating layer(s) and cover layer, in particular an optical modulation region of the phase modulator.

FIG. 7 shows a cross-section of an optical modulation region of another phase modulator 20 according to an embodiment of the disclosure, which builds on the embodiment shown in FIG. 2, and shares some elements with the embodiment shown in FIG. 6. Same elements in FIG. 2, FIG. 6, and FIG. 7 are labelled with the same reference signs and may be implemented likewise. In particular, the phase modulator 20 of FIG. 7 comprises non-planar insulating layer(s) 23 and cover layer 24. The one or more insulating layers 23 and the p-type cover layer 24 are wrapped around a top portion of the ridge waveguide 22. In contrast to the phase modulator of FIG. 6, the phase modulator 20 of FIG. 7 does not have a ridge waveguide 22 with a top portion that is wider than its narrower bottom portion. Instead, the bottom and top portion of the ridge waveguide 22 have similar or same width.

Figure 8:
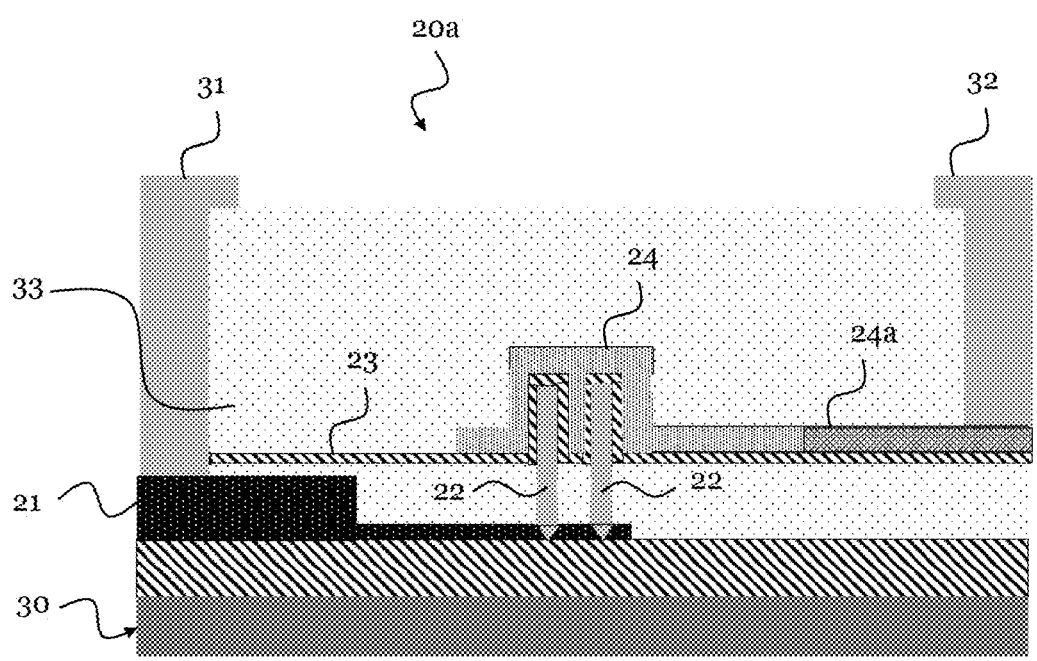
FIG. 8 shows another phase modulator according to an embodiment of the disclosure with non-planar insulating layer(s) and cover layer, in particular an optical modulation region of the phase modulator.

FIG. 8 shows a cross-section of an optical modulation region of another phase modulator 20 according to an embodiment of the disclosure, which builds on the embodiment shown in FIG. 2, and shares some elements with the embodiment shown in FIG. 7. Same elements in FIG. 2, FIG. 7, and FIG. 8 are labelled with the same reference signs and may be implemented likewise. In particular, the phase modulator 20 of FIG. 7 comprises non-planar insulating layer(s) 23 and cover layer 24. The one or more insulating layers 23 and the p-type cover layer 24 may be wrapped around a top portion of the ridge waveguide 22. In particular, the ridge waveguide 22 in this embodiment comprises two portions, which protrude side by side from the n-type base layer 21. Each of the two portions may be wrapped by the one or more insulating layers 23 and by the cover layer 24.

Figure 9:
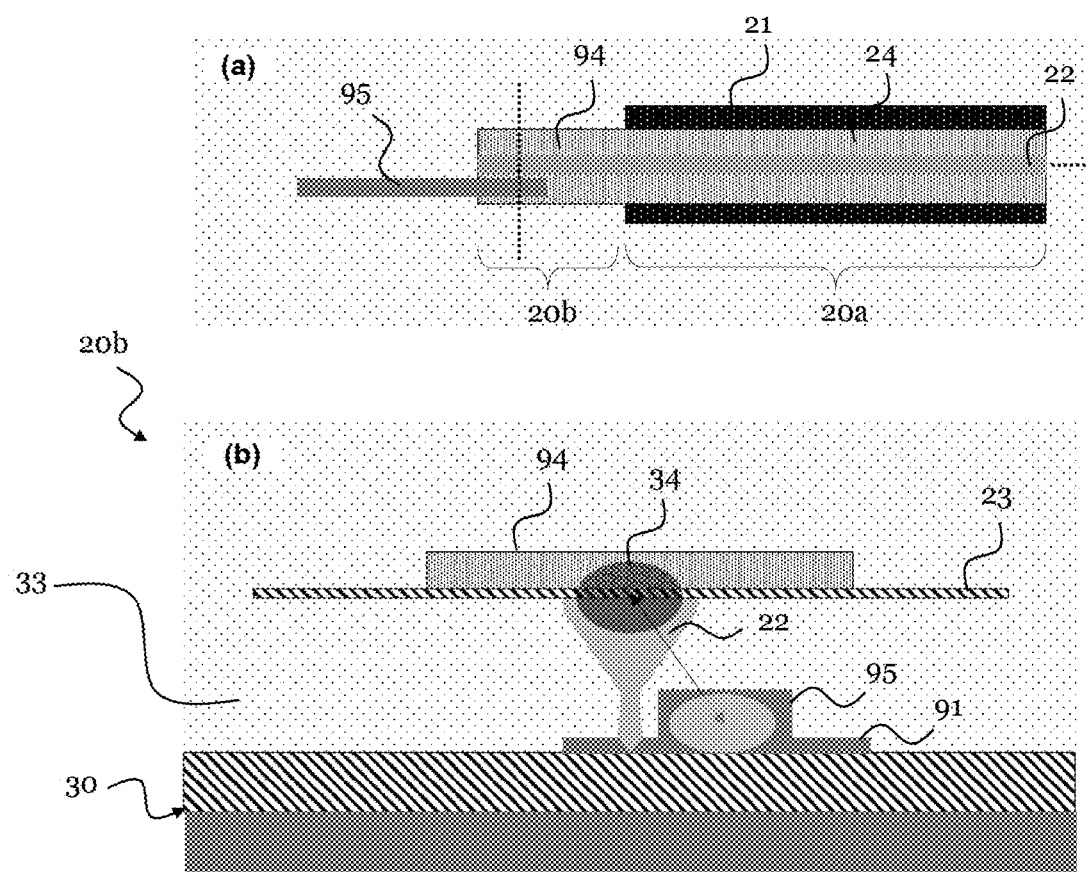
FIG. 9, parts (a) and (b), show a phase modulator according to an embodiment of the disclosure, in particular an optical transition region of the phase modulator.

FIG. 9, part (a), shows a top view (contact/metal layers are omitted) of both the optical modulation region ("phase shifter") and the optical transition region ("waveguide transition") of another phase modulator 20 according to an embodiment of the disclosure. FIG. 9, part (b), shows a cross-section of an optical transition region of the phase modulator 20 of FIG. 9, part (a), in particular along the dotted line shown in FIG. 9, part (a).

As shown in FIG. 9, part (b), in the optical transition region the phase modulator 20 comprises a silicon-based NID base layer 91, the n-type ridge waveguide 22 protruding from and extending along the NID base layer 91, the one or more insulating layers 23 provided on the ridge waveguide 22, and a silicon-based NID cover layer 94 provided on the one or more insulating layers 23 at least above a part of the ridge waveguide 22. The NID base layer 91 in the optical transition region and the n-type base layer 21 in the optical modulation region may be formed by the same layer (e.g., by a top layer of a SOI substrate) which is provided with distinct undoped regions (for NID) and doped regions (for n-type). Likewise, the NID cover layer 94 in the optical transition region and the p-type cover layer 24 in the optical modulation region may be formed by the same layer provided with distinct undoped regions (for NID) and doped regions (for p-type).

In the optical transition region, the ridge waveguide 22 may be formed in a similar manner on the NID base layer 91 as it is formed on the n-type base layer 21 in the optical modulation region. In particular, the ridge waveguide 22 may be partly arranged in a trench 110 formed in the NID base layer 91, and/or the ridge waveguide 22 may be grown on a V-groove formed in the NID base layer 91. The trench 110 and/or V-groove may extend along the base layer across undoped regions (for NID) and doped regions (for n-type).

The optical transition region of the phase modulator 20 may be beneficial for establishing a low-loss light path between a silicon-based waveguide 95 and the III-V ridge waveguide 22. In particular, the (passive) silicon-based waveguide 95 may be formed adjacent to the ridge waveguide 22 on or by the NID base layer 91. The ridge waveguide 22 and the silicon-based waveguide 95 may be configured and arranged such that light propagating along one of the waveguides 22, 95 may be coupled into the other one of the waveguides 22, 95. For instance, the center of the silicon-based waveguide 95 may be distanced from the bottom portion of the ridge waveguide 22 by around 300-350 nm, e.g. around 315 nm. The silicon-based waveguide 95 may comprise a tapered end and/or may be curved, to support the coupling. The silicon-based waveguide 95 may be directional, linearly tapered, and/or an advanced adiabatic coupler, to support the coupling. Thereby, as shown in FIG. 9, part (b), the optical mode moves up when light is coupled from the silicon-based waveguide 95 into the ridge waveguide 22, until the insulating layer(s) 23 is positioned at the middle of the optical mode.

Figure 10:
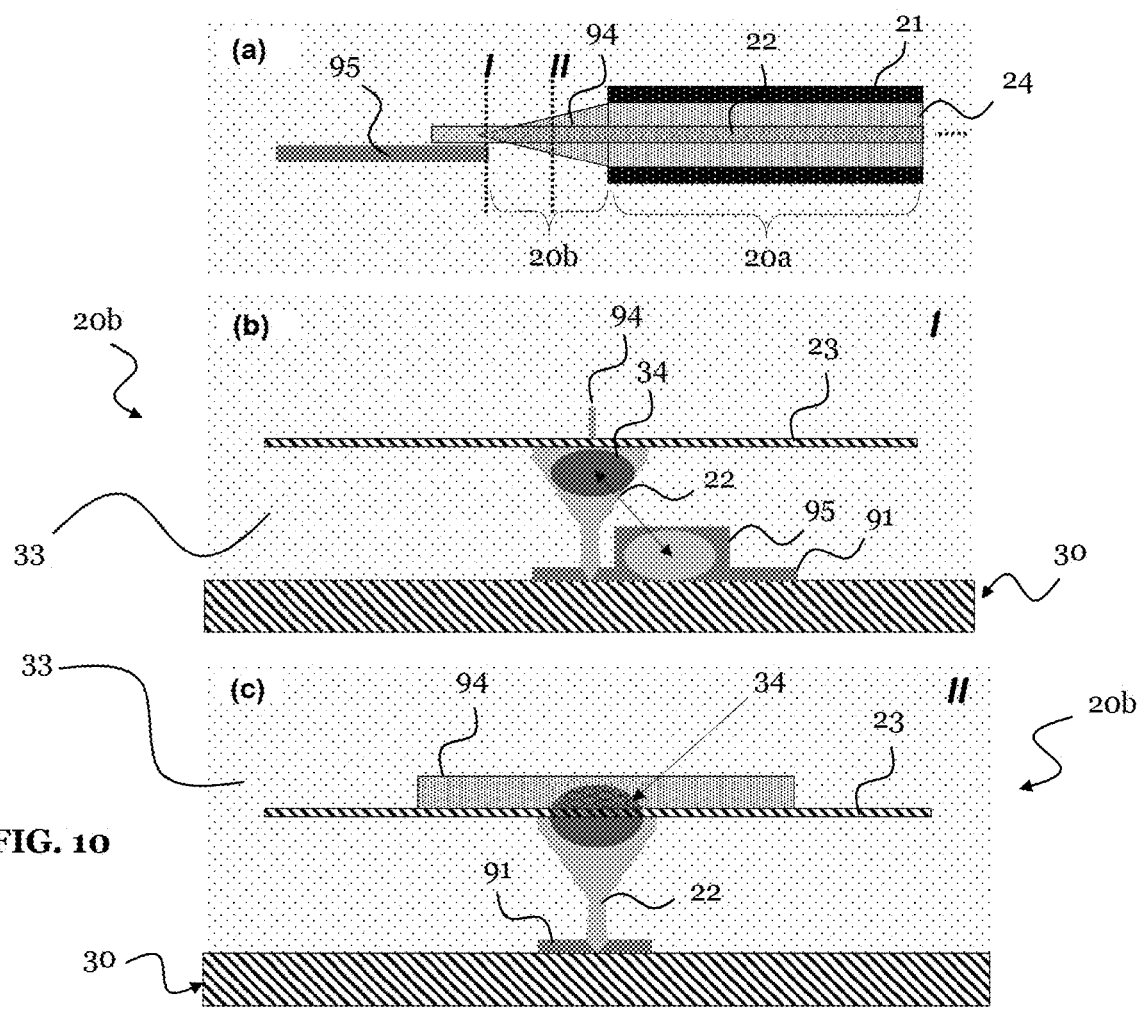
FIG. 10, parts (a), (b), and (c) show another phase modulator according to an embodiment of the disclosure, in particular an optical transition region of the phase modulator.

FIG. 10, part (a), shows a top view of both the optical modulation region ("phase shifter") and the optical transition region ("waveguide transition") of another phase modulator 20 according to an embodiment of the disclosure. FIGS. 10, part (b), and 10, part (c), show cross-sections of an optical transition region of the phase modulator 20, in particular along the two dotted lines shown in FIG. 10, part (a). Same elements in FIG. 9 and FIG. 10 are labelled with the same reference signs and may be implemented likewise.

FIG. 10, part (a), shows that the NID cover layer 94 may be tapered in the optical transition region. FIG. 10, part (c), shows the optical transition region where the silicon-based waveguide 95 may be formed adjacent the ridge waveguide 22. FIG. 10, part (b), shows the optical transition region where the silicon-based waveguide 95 is not formed, and only the NID base layer 91 may be formed supporting the ridge waveguide 22.

Figure 11:
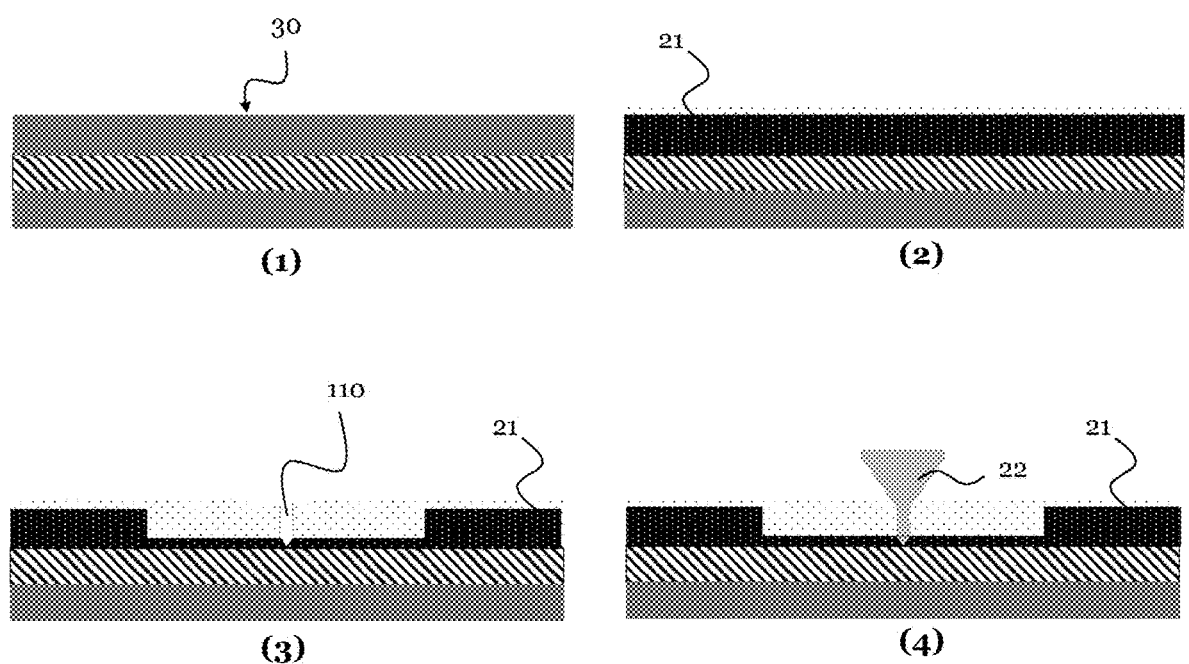
FIG. 11, parts (1), (2), (3) and (4) show steps of a first integration flow for fabricating a phase modulator according to an embodiment of the disclosure.
Figure 12:
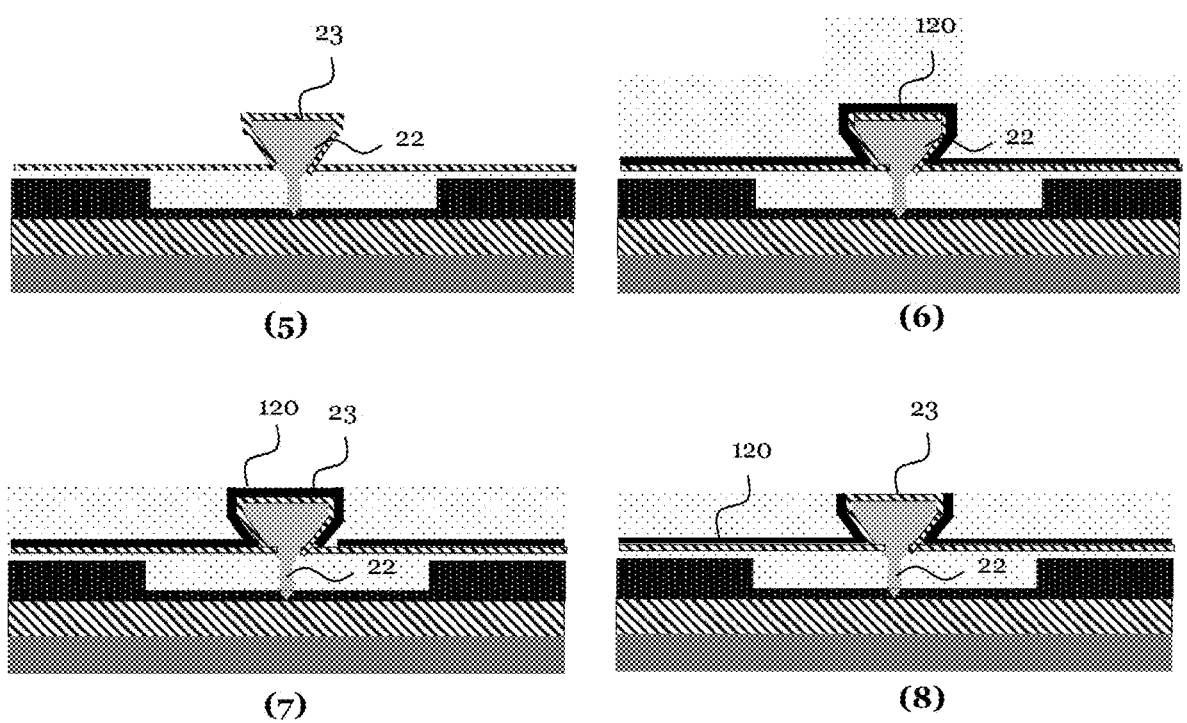
FIG. 12, parts (5), (6), (7), and (8), show steps of the first integration flow for fabricating a phase modulator according to an embodiment of the disclosure.
Figure 13:
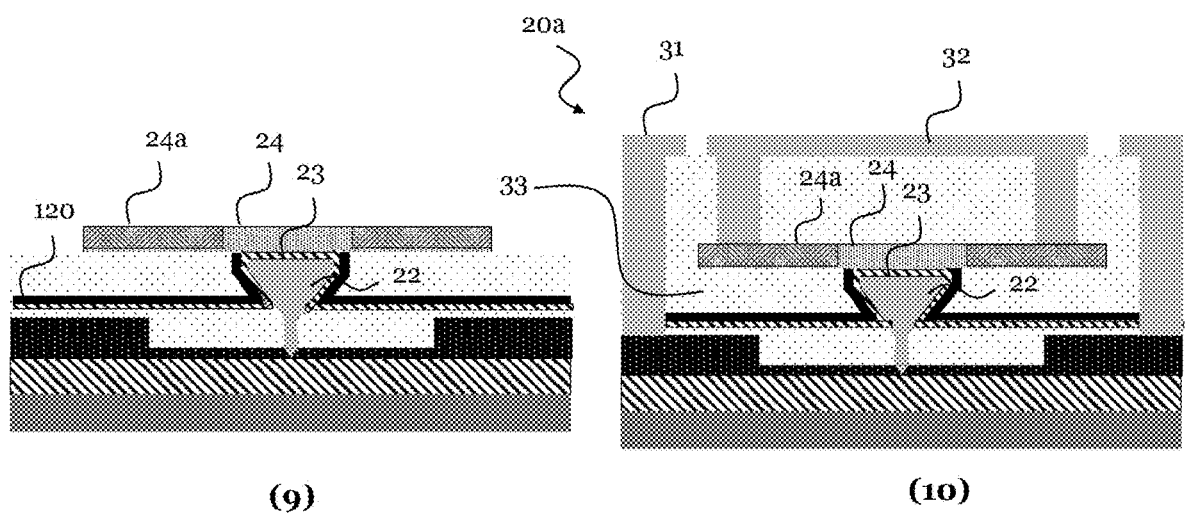
FIG. 13, parts (9) and (10) show steps of the first integration flow for fabricating a phase modulator according to an embodiment of the disclosure.

FIG. 11-13 show a first integration scheme for fabricating a phase modulator 20 according to an embodiment of the disclosure. In particular, FIG. 11, parts (1), (2), (3), and (4), shows steps 1-4 of the first integration scheme, FIG. 12, parts (5), (6), (7), and (8), shows steps 5-8, and FIG. 13, parts (9) and (10), shows steps 9 and 10.

In step 1, a SOI substrate comprising a NID silicon top layer may be provided. In step 2, the NID silicon top layer of the SOI may be n-doped to form the n-type (silicon) base layer 21.

In step 3, a hole may be patterned into the n-type base layer 21 and the hole may filled by a dielectric material (e.g., silicon oxide), the dielectric material may be etched, and a silicon V-groove 110 may be formed through the etched dielectric material into the n-type base layer 21.

In step 4, the III-V semiconductor material ridge waveguide 22 may be grown onto the silicon V-groove, particularly employing ART growth.

In step 5, the one or more insulating layers 23 may be formed (e.g., a gate oxide may be deposited). Exemplarily, the one or more insulating layers 23 may wrap around the top portion of the ridge waveguide 22. In step 6, a silicon nitride layer 120 and a dielectric material (e.g., silicon oxide) may be deposited (wrapping around the one or more insulating layers 23 and the top portion of the ridge waveguide 22).

In step 7, the dielectric material may be planarized to form a planar surface together with the top surface of the silicon nitride 120. In step 8, the silicon nitride 120 may be etched to expose the top surface of the one or more insulating layers 23.

In step 9, the p-type silicon-based cover layer 24 (e.g., poly-Si) may be provided on the planar top surface, and thus on the exposed one or more insulating layers 23. Notably, the cover layer 24 may thereby not wrapped around the top portion of the ridge waveguide 22. In step 10, the first contacts 31 and second contacts 32 may be formed, e.g., metal layers are deposited. Thus, the phase modulator 20 may be fabricated.

Figure 14:
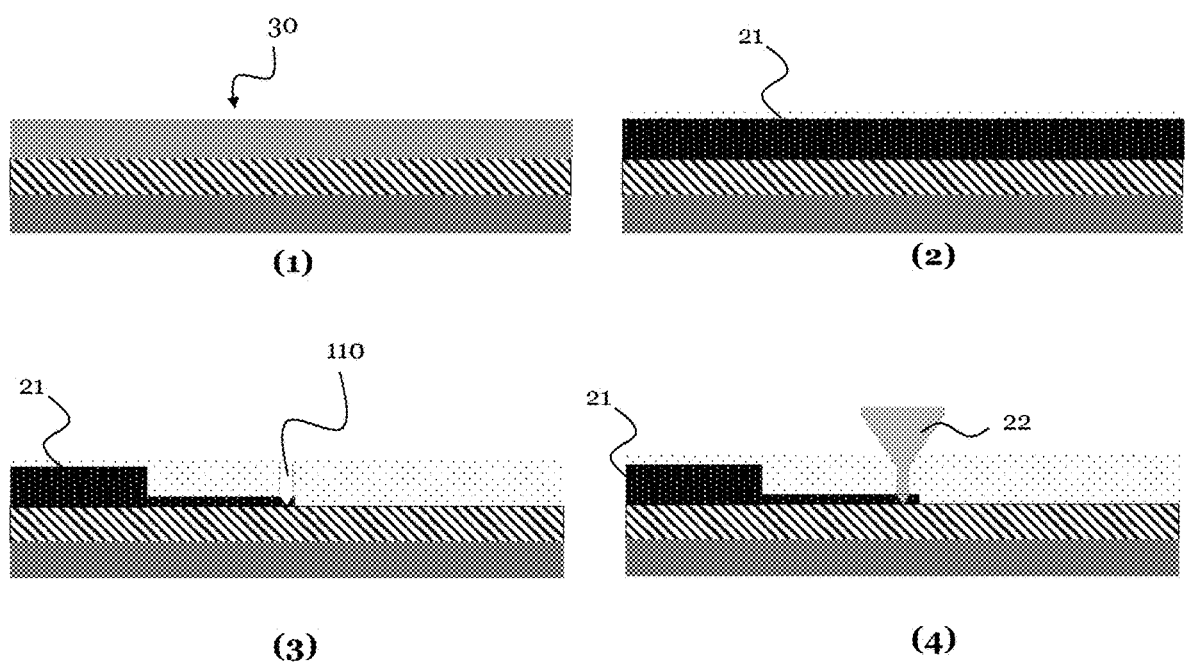
FIG. 14, parts (1), (2), (3) and (4), show steps of a second integration flow for fabricating a phase modulator according to an embodiment of the disclosure.
Figure 15:
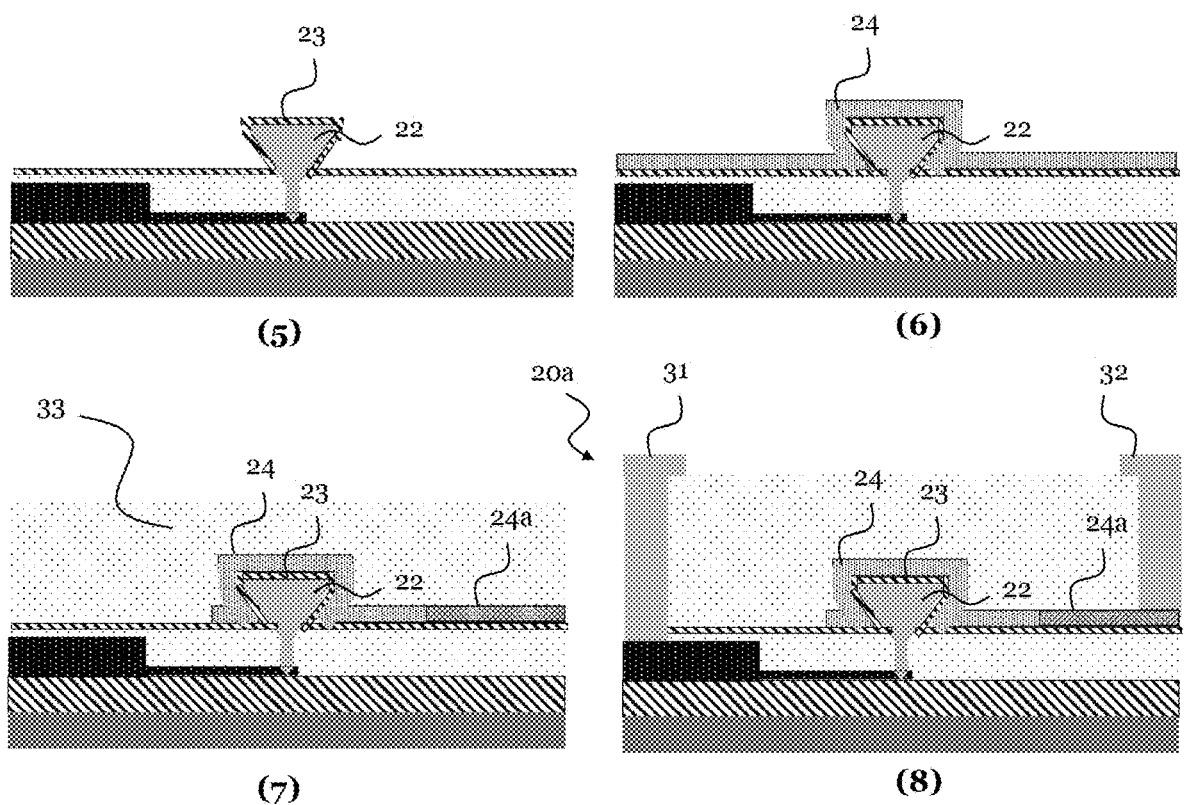
FIG. 15, parts (5), (6), (7) and (8) show steps of the second integration flow for fabricating a phase modulator according to an embodiment of the disclosure.

FIG. 14-15 show a second integration scheme for fabricating a phase modulator 20 according to an embodiment of the disclosure. In particular, FIG. 14, parts (1), (2), (3) and (4), shows steps 1-4 of the second integration scheme, and FIG. 15, parts (5), (6), (7) and (8), shows steps 5-8.

In step 1, like in the first integration scheme, a SOI substrate comprising a NID silicon top layer may be provided. In step 2, the NID silicon top layer of the SOI may be n-doped to form the n-type (silicon) base layer 21.

In step 3, similar as in the first integration scheme, a hole may be patterned into the n-type base layer 21 (in contrast to the first integration scheme, thereby removing the n-type base layer 21 on the right side of the SOI substrate as is illustrated), the hole may be filled by a dielectric material (e.g., silicon oxide), the dielectric material may be etched, and a silicon V-groove 110 may be formed through the etched dielectric material into the n-type base layer 21. In step 4, the III-V semiconductor material ridge waveguide may be grown onto the silicon V-groove, particularly employing ART growth.

In step 5, like in the first integration scheme, the one or more insulating layers 23 may be formed (e.g., a gate oxide may be deposited). Exemplarily, the one or more insulating layers 23 wrap around the top portion of the ridge waveguide 22. In step 6, the p-type silicon-based cover layer 24 (e.g., poly-Si) may be provided wrapping around the one or more insulating layers 23 and the top portion of the ridge waveguide 22.

In step 7, the p-type cover layer 24 may be patterned (removing part of the cover layer 24 on the left side of the SOI substrate, above the n-type base layer 21). Then, an implantation step for forming a p+ region in the p-type cover layer 24 may be performed (right side), and a dielectric material (e.g., silicon dioxide) may be deposited, to surround or embed the ridge waveguide 22. Further, the one or more insulating layers 23 may be wrapped around the top portion of the ridge waveguide 22, and the cover layer 24 may be wrapped around the one or more insulating layers 23 and the top portion of the ridge waveguide 22. In step 8, a first contact 31 and a second contact 32 may be formed, e.g., metal layers are deposited. Thus, the phase modulator 20 may be fabricated.

As discussed above, according to embodiments of the disclosure, a highly manufacturable and efficient III-V-on silicon (hybrid) phase modulator 20 can be achieved. The phase modulator 20 can be achieved by implementing the III-V-on silicon using a (nano)-ridge waveguide. Embodiments of the disclosure enable a pathway to fabricating highly efficient and low-loss III-V on silicon hybrid optical modulators in silicon photonics in a manufacturable way.

The invention claimed is:

1. A monolithic integrated electro-optical phase modulator, wherein the phase modulator comprises, in an optical modulation region:
    a silicon-based n-type base layer;
    an n-type ridge waveguide for propagating light, wherein the ridge waveguide protrudes from and extends along the n-type base layer and is made of III-V semiconductor material;
    one or more insulating layers provided on the ridge waveguide, wherein the one or more insulating layers have together a thickness in a range of 1-100 nm; and
    a silicon-based p-type cover layer provided on the one or more insulating layers at least above the ridge waveguide,
    wherein the ridge waveguide, the one or more insulating layers, and the p-type cover layer form together a monolithically integrated semiconductor-insulator-semiconductor capacitor for phase modulating the light propagating along the ridge waveguide in the optical modulation region.

2. The phase modulator according to claim 1, further comprising:
    one or more first contacts provided on the n-type base layer; and
    one or more second contacts provided on the p-type cover layer,
    wherein a voltage applied between the one or more first contacts and the one or more second contacts causes the light propagating along the ridge waveguide to be phase modulated in the optical modulation region.

3. The phase modulator according to claim 1, wherein:
    the one or more insulating layers and the p-type cover layer are planar and provided on a planar top surface of the ridge waveguide.

4. The phase modulator according to claim 1, wherein:
    the one or more insulating layers and the p-type cover layer are wrapped around a top portion of the ridge waveguide.

5. The phase modulator according claim 1, wherein:
    the ridge waveguide, the one or more insulating layers, and the p-type cover layer are surrounded by or embedded into a dielectric material.

6. The phase modulator according to claim 1, wherein the phase modulator comprises, in an optical transition region:
    a silicon-based not-intentionally-doped, NID, base layer;
    the n-type ridge waveguide protruding from and extending along the NID base layer;
    the one or more insulating layers provided on the ridge waveguide; and
    a silicon-based NID cover layer provided on the one or more insulating layers at least above a part of the ridge waveguide.

7. The phase modulator according to claim 6, further comprising:
    a silicon-based waveguide formed adjacent to the ridge waveguide on or by the NID base layer.

8. The phase modulator according to claim 7, wherein:
    the ridge waveguide and the silicon-based waveguide are configured and arranged such that light propagating along one of the waveguides is coupled into the other one of the waveguides.

9. The phase modulator according to claim 6, wherein:
    the NID cover layer is tapered in the optical transition region.

10. The phase modulator according to claim 6, wherein:
    the ridge waveguide is partly arranged in a trench formed in the n-type base layer, the NID base layer, or both; and
    the ridge waveguide is grown on a V-groove formed in the n-type based layer, the NID base layer, or both.

11. The phase modulator according to claim 6, wherein:
    the n-type base layer, the NID base layer, or both are formed by a top layer of a silicon-on-insulator substrate.

12. The phase modulator according to claim 6, wherein:
the ridge waveguide comprises a narrower bottom portion arranged on the n-type base layer, the NID base layer, or both and a wider top portion arranged on top of the bottom portion; and
the wider top portion has a rectangular cross-section or a triangular cross-section.

13. The phase modulator according to claim 6, wherein:
the ridge waveguide comprises two portions protruding side by side from the n-type base layer, the NID base layer, or both.

14. A Mach-Zehnder modulator comprising:
an optical input and an optical output;
a first waveguide arm and a second waveguide arm, wherein each waveguide arm connects the optical input with the optical output; and
one or more phase modulators according to claim 1,
wherein at least one of the phase modulators is arranged in the first waveguide arm, the second waveguide arm, or both.

15. The Mach-Zehnder modulator according to claim 14, wherein the one or more phase modulators further comprise:
one or more first contacts provided on the n-type base layer; and
one or more second contacts provided on the p-type cover layer,
wherein a voltage applied between the one or more first contacts and the one or more second contacts causes the light propagating along the ridge waveguide to be phase modulated in the optical modulation region.

16. The Mach-Zehnder modulator according to claim 14, wherein the one or more phase modulators further comprise, in an optical transition region:
a silicon-based not-intentionally-doped, NID, base layer;
the n-type ridge waveguide protruding from and extending along the NID base layer;
the one or more insulating layers provided on the ridge waveguide; and
a silicon-based NID cover layer provided on the one or more insulating layers at least above a part of the ridge waveguide.

17. The Mach-Zehnder modulator according to claim 16, further comprising:
a silicon-based waveguide formed adjacent to the ridge waveguide on or by the NID base layer.

18. The Mach-Zehnder modulator according to claim 17, wherein:
the ridge waveguide and the silicon-based waveguide are configured and arranged such that light propagating along one of the waveguides is coupled into the other one of the waveguides.

19. A method for fabricating a monolithic integrated electro-optical phase modulator, wherein for fabricating an optical modulation region of the phase modulator, the method comprising:
providing a silicon-based n-type base layer;
growing an n-type ridge waveguide for propagating light, wherein the ridge waveguide is grown protruding from and extending along the n-type base layer and is made of III-V semiconductor material;
forming one or more insulating layers on the ridge waveguide, wherein the one or more insulating layers have together a thickness in a range of 1-100 nm; and
forming a silicon-based p-type cover layer on the one or more insulating layers at least above the ridge waveguide,
wherein the n-type ridge waveguide, the one or more insulating layers, and the p-type cover layer form together a monolithically integrated semiconductor-insulator-semiconductor capacitor for phase modulating the light propagating along the ridge waveguide in the optical modulation region.

* * * * *